United States Patent
Lamb et al.

(10) Patent No.: US 10,541,626 B1
(45) Date of Patent: Jan. 21, 2020

(54) POWER CONVERSION SYSTEM WITH PWM CARRIER EMULATION

(71) Applicant: Rockwell Automation Technologies, Inc., Mayfield Heights, OH (US)

(72) Inventors: Jacob M. Lamb, Jackson, WI (US); Brian J. Seibel, Grafton, WI (US); Timothy M. Rowan, Wauwatosa, WI (US); Lixiang Wei, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/247,634

(22) Filed: Jan. 15, 2019

(51) Int. Cl.
| | | |
|---|---|---|
| *H02M 5/45* | (2006.01) | |
| *H02P 27/06* | (2006.01) | |
| *H02M 7/5387* | (2007.01) | |
| *H03K 3/017* | (2006.01) | |
| *H02P 27/08* | (2006.01) | |
| *H02M 5/458* | (2006.01) | |

(52) U.S. Cl.
CPC ..... *H02M 7/53875* (2013.01); *H02M 5/4585* (2013.01); *H02P 27/08* (2013.01); *H03K 3/017* (2013.01)

(58) Field of Classification Search
CPC ...... H02P 27/08; H03K 3/017; H02M 5/4585; H02M 7/53875; H02M 2001/123; H02M 1/12
USPC ..... 363/34–41, 97, 98, 131, 132; 318/400.3, 318/504, 722, 803, 807
See application file for complete search history.

(56) References Cited

U.S. PATENT DOCUMENTS

| | | | |
|---|---|---|---|
| 6,704,212 B2 | 3/2004 | Furukawa et al. | |
| 6,847,532 B2 | 1/2005 | Villaret | |
| 7,049,778 B2 * | 5/2006 | Katanaya | H02M 7/53873 318/400.04 |
| 7,391,181 B2 | 6/2008 | Welchko et al. | |
| 7,471,526 B2 | 12/2008 | Welchko et al. | |
| 8,427,123 B2 | 4/2013 | Dearborn | |
| 9,236,828 B1 | 1/2016 | Wei et al. | |
| 9,318,976 B1 * | 4/2016 | Wei | H02M 7/537 |
| 9,490,690 B2 * | 11/2016 | Bhandarkar | H02M 7/219 |
| 9,753,067 B2 * | 9/2017 | Deng | G01R 25/00 |
| 9,800,134 B2 * | 10/2017 | Patel | H03H 7/06 |
| 10,158,299 B1 * | 12/2018 | Wei | H02M 5/4585 |
| 2006/0290312 A1 * | 12/2006 | Nagai | H02P 6/182 318/599 |
| 2008/0088385 A1 * | 4/2008 | Gizara | G06F 1/025 332/109 |
| 2012/0033470 A1 | 2/2012 | Muneshima et al. | |
| 2018/0034402 A1 * | 2/2018 | Yoshimura | H02P 27/047 |

* cited by examiner

*Primary Examiner* — Rajnikant B Patel
(74) *Attorney, Agent, or Firm* — Fay Sharpe LLP

(57) ABSTRACT

Power conversion systems and a controller thereof includes a first processing system that computes phase references for respective phase lines of an inverter according to a feedback value, a setpoint value, and a scaling factor to emulate a scaled frequency that is less than a switching frequency, and a second processing system that generates a carrier waveform having the switching frequency, receives the phase reference from the first processing system for each inverter phase line, and compares each phase reference with the carrier waveform to generate pulse width modulated switching control signals for switching devices of the inverter.

20 Claims, 5 Drawing Sheets

PATENT

POWER CONVERSION SYSTEM WITH PWM CARRIER EMULATION

BACKGROUND INFORMATION

The subject matter disclosed herein relates to power conversion.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present the concept of the disclosure in a simplified form prior to the more detailed description that is presented hereinafter. One described example includes a power conversion system with a rectifier and inverter, and a controller with first and second processing systems. The first processing system is configured to compute phase references for respective phase lines of the inverter according to a feedback value, a setpoint value, and a scaling factor to emulate a scaled frequency that is less than a switching frequency. The second processing system is configured to generate a carrier waveform having the switching frequency, receive the phase reference from the first processing system for each inverter phase line, and compare each phase reference with the carrier waveform to generate pulse width modulated switching control signals for the inverter switching devices.

An example method includes computing phase references using a first processor for respective phase lines of an inverter according to a feedback value, a setpoint value, and a scaling factor to emulate a scaled frequency that is less than a switching frequency, as well as using a second processor to generate a carrier waveform having the switching frequency, receive the phase reference from the first processing system for each inverter phase line, and compare each phase reference with the carrier waveform to generate pulse width modulated switching control signals for switching devices of the inverter, and operating the inverter switching devices using a driver circuit according to the pulse width modulated switching control signals to drive a load.

DETAILED DESCRIPTION

Figure 1:
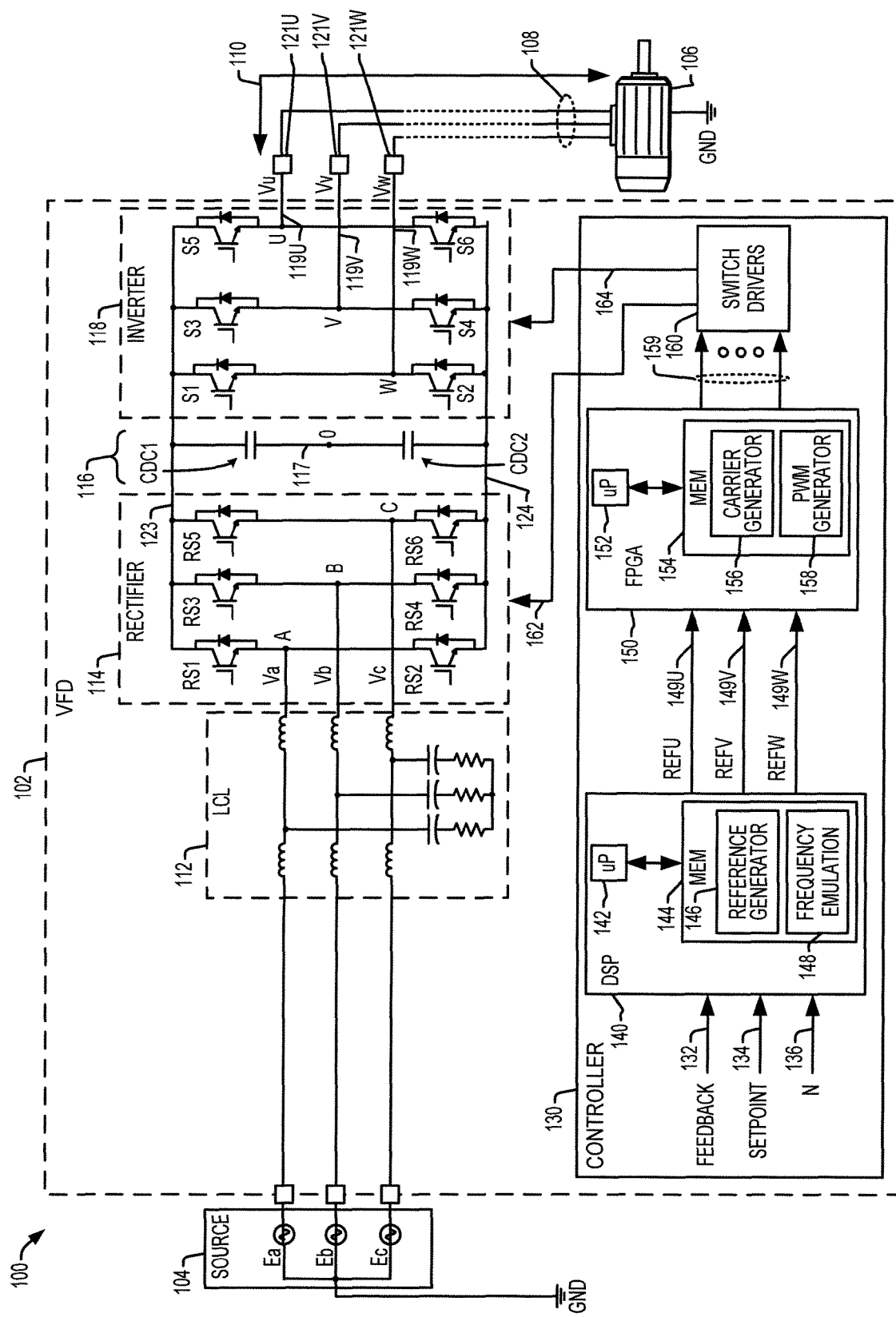
FIG. 1 is a schematic diagram.

Referring now to the figures, several embodiments or implementations are hereinafter described in conjunction with the drawings, wherein like reference numerals are used to refer to like elements throughout, and wherein the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Motor drives and other types of power conversion systems typically use semiconductor switching devices, such as IGBTs or other transistors having one or more p-n junctions. Switching such devices at high switching frequencies may lead to elevated junction temperatures. Junction over-temperature faults are an issue, particularly at low fundamental (commanded) frequencies. In many applications, it is therefore desirable to decrease IGBT junction temperatures to avoid these faults, and the junction temperatures can be decreased by reducing the switching frequency. For example, inverter switches are often actuated by of pulse width modulated (PWM) switching control signals at an inverter switching frequency, where the amplitude of the resulting inverter output signals is controlled by the on-time of the PWM signal within a given switching period. The modulation in many cases includes comparing a phase reference signal for each output phase with a carrier signal. The carrier signal can be a variety of different waveform shapes, such as a triangle wave that oscillates at the switching frequency. Simply lowering the switching frequency (i.e., lowering the carrier frequency), however, can reduce control bandwidth.

In some applications, it may be beneficial to utilize lower carrier frequencies (i.e., lower switching frequencies) at lower commanded output frequency (e.g., motor speed), while using higher carrier frequencies if higher bandwidth is desired. However, dynamic switching frequency changes may be difficult where separate processing systems are used for the carrier signal generation and reference signal generation. In particular, various control functions are dependent on carrier (i.e., switching) frequency. For example, dead-time compensation and junction temperature calculation functions are dependent upon the switching frequency, and propagation delays during frequency changes may lead to instability or other problems. In addition, dynamically changing the switching frequency may significantly increase communication traffic between first and second processing systems to control output load stability.

FIG. 1 shows an example system 100 with a motor drive power conversion system 102 that advantageously emulates carrier frequencies in a first processing system that provides phase references to a second processing system which implements carrier generation and reference comparison for generating PWM control signals. This novel approach allows carrier frequency emulation by the first processing system to facilitate benefits of a lower switching frequency without reducing bandwidth, without requiring increased communications between the first and second processing systems. The disclosed examples provide significant improvements over other approaches to lower operating frequency. U.S. Pat. No. 9,318,976 to Wei et al., incorporated herein by reference in its entirety, entitled "Adjustable PWM method to increase low speed starting torque and inverter voltage measurement accuracy" accumulates duty ratio command based on magnitude reference, with the goal of ensuring a minimum pulse width. U.S. Pat. No. 7,391,181 to Welchko et al., incorporated herein by reference in its entirety, entitled "Loss minimized PWM for voltage source inverters taking into account inverter non-linearity" describes changing between discontinuous PWM (DPWM) methods based on a desired pulse width. US patent application publication number 2012/0033470 to Muneshima et al., incorporated herein by reference in its entirety, entitled "Method of controlling power conversion device" describes a DPWM method that increases pulse widths using an accumulator.

FIG. 1 shows an example industrial power system 100 with a motor drive power conversion system 102 that receives and converts AC electrical input power from a source 104 to drive a motor load 106 through a motor cable 108 having a cable length 110. The example AC input and output of the converter 102 are three phase configurations. Other implementations are possible using any combination of single or multiphase inputs and outputs to drive a motor 106 or other type of load. The example motor drive 102 is a voltage source converter (VSC) motor drive, which includes an input filter 112, a rectifier 114, a DC bus circuit 116 with DC bus capacitors CDC1 and CDC2 that define a center node 117 (e.g., zero volts). The DC bus voltage of the bus circuit 116 drives an inverter 118 with an inverter output 119 (e.g., output phase lines 119U, 119V and 119W) connected to output terminals 121U, 121V and 121W to drive a load 106 through the cable 108.

The motor drive 102 also includes a controller or control circuit 130 to provide switching control signals to the inverter 118, as well as rectifier switching control signals to an active front end (AFE) implementation of the rectifier 114 as shown in FIG. 1. In certain examples, an output filter and/or an output transistor (not shown) can be connected between the inverter output 119 and the motor cable 108, for example, to drive a motor load 106 through a cable 108 having a long length 110 for electronic submersible pump (ESP) applications. The DC bus circuit 116 includes a first DC power path or node 123, and a second DC power path or node 124.

The rectifier 114 includes a rectifier input A, B, C configured to receive a rectifier AC input signal Va, Vb, Vc, as well as a rectifier output configured to provide the DC voltage output signal to the DC bus circuit 116. In the illustrated example, the rectifier 114 is an active rectifier with rectifier switching devices RS1-RS6 coupled between the rectifier input A, B, C and the rectifier output. In other examples, a passive rectifier can be used (not shown). The power conversion system 100 in one example can include a filter (not shown) between the source 104 and the motor drive 102. In the example of FIG. 1, the filter 112 operates as an input filter connected between the source 104 and the rectifier input A, B, C. The filter 112 in this example includes phase-specific L-C-L (inductor-capacitor-inductor) circuit components. In other implementations the filter 112 can be omitted. The example three phase AC power source 104 provides AC phase voltage signals Ea, Eb and Ec through the filter 130 to the inputs of the input filter 112, and the filter 112 provides filtered AC input voltage signals Va, Vb and Vc to the respective phase input lines A, B and C of the rectifier 114. In one implementation, the motor drive 102 includes a housing that encloses the filter 112, the active rectifier 114, the DC bus circuit 116, the inverter 118, and the controller 130.

In one example, the switching rectifier 114 and the inverter 118 operate at pulse width modulation (PWM) switching frequencies of several hundred hertz up to several kilohertz. In one example, the filter 112 (when included) is designed to reduce or filter out all or at least a portion of the frequency content in the range of the pulse width modulation switching frequencies of the rectifier 114 and/or the inverter 118. The inverter 118 includes a DC input coupled with the DC bus circuit 116, and a plurality of inverter switching devices S1-S6 coupled between the DC input and the inverter output 119 The inverter switches S1-S6 are configured to operate according to inverter switching control signals from the controller 130 in order to provide an inverter output signal Vu, Vv, Vw at the inverter output 119 to directly or indirectly drive the load 106.

The inverter 118 switching devices S1-S6 are individually coupled between a corresponding one of the DC current paths 123 or 124 of the intermediate DC circuit 116 and a corresponding one of the AC output phase lines 119U, 119V or 119W (also labeled U, V, and W in FIG. 1). The inverter switching devices S1-S6 are individually operative according to corresponding inverter switching control signals from the controller 130 in order to selectively electrically couple the corresponding DC current path with the corresponding AC output node. The controller 130 provides the inverter switching control signals in order to cause the inverter 118 to generate a controlled amplitude and frequency of the single or multiphase AC output signal used to drive a motor load 106. In this manner, the controller 130 can implement a variety of different motor control functions, including speed control, torque control, etc.

The rectifier 114 can be a passive rectifier including one or more diode rectifier components, or may be an active front end (AFE) system with one or more rectifier switching devices RS1, RS2, RS3, RS4, RS5 and RS6 (e.g., IGBTs, etc.). The example active rectifier switches RS1-RS6 are configured to operate according to rectifier switching control signals from the controller 130 to convert input AC electrical power to provide the DC bus voltage in the DC bus circuit 116. The rectifier switching devices RS1-RS6 are individually coupled between a corresponding one of the rectifier input nodes A, B, or C and a corresponding one of the first and second DC output nodes 123 or 124. In operation, the rectifier switching devices RS1-RS6 individually operate according to a corresponding rectifier switching control signal to selectively couple a corresponding rectifier input node A, B, or C with a corresponding DC output node 123 or 124 according to a corresponding rectifier switching control signal from the controller 130. The controller 130 provides the rectifier switching control signals in order to control conversion of AC input power received by the rectifier 114 into a controlled or regulated DC bus voltage in the DC bus circuit 116.

The illustrated motor drive 102 is a voltage source converter configuration including one or more capacitive storage elements in the DC bus circuit 116. The DC bus circuit 116 may include a single capacitor CDC or multiple capacitors (e.g., CDC1 and CDC2 in FIG. 1) connected in any suitable series, parallel and/or series/parallel configuration to provide a DC bus capacitance across the inverter input terminals. The intermediate DC bus circuit 116 in one example includes first DC current path 123 coupled with the first DC output node of the rectifier 114, and a second DC current path 124 coupled with the second DC output node of the rectifier 114.

The controller 130 in one example includes multiple processors and associated electronic memories which store program instructions to implement a closed loop control program to regulate or control one or more of voltage, current, speed, torque, etc. The controller 130 in certain embodiments implements a motor speed and/or position and/or torque control scheme in which the controller 130 selectively provides the switching control signals to the inverter switches S1-S6 in a closed and/or open-loop fashion according to one or more feedback values 132 (e.g., speed, voltage, torque, current values, etc.), and according to one or more setpoint values such as a motor speed setpoint 134. The setpoint 134 in one example is a signal or value generated by the controller 130, or a fixed setpoint value, or such setpoint value can be received from an external system (not shown). In practice, the motor drive 102 may also receive a torque setpoint and/or a position (e.g., angle) setpoint, and such desired signals or values (setpoint(s)) may be received from a user interface and/or from an external device such as a distributed control system, etc. (not shown). As used herein, a signal can be an analog signal, such as a current or a voltage signal, or a signal can include digital values generated or consumed by the controller 130. The controller 130 also receives an odd integer scaling factor 136 (N). Similar to the setpoint, the scaling factor 136 can be internally generated based on one or more operating conditions. In another example, the scaling factor 136 is a programmed parameter stored in controller memory. In other implementations, the scaling factor 136 can be received from an external control system, etc. (not shown).

The example controller 130 includes a first processing system 140 and a second processing system 150. The individual processing systems 140 and 150 can be implemented using any suitable hardware, processor executed software or firmware, or combinations thereof, wherein an example of the controller 130 includes multiple processing elements such as microprocessors, microcontrollers, DSPs, programmable logic, etc., along with one or more associated electronic memory components with program and data memory storage, with the processing elements programmed or otherwise configured to generate signals suitable for operating the switching devices of the inverter 118, and any switches of an included active front end rectifier 114. The program instructions stored in the controller 130, when executed by the processing elements thereof, cause the processing elements to implement the functions detailed herein and other functions associated with operating a power conversion system.

In one example, the first processing system 140 is a digital signal processor (DSP) with a first processor 142 and a first memory 144 (labeled MEM in the drawing). In operation, the first processor 140 executes program instructions from the first memory 144 to implement various features associated with operating the motor drive 102. In one example, the memory 144 includes program instructions to implement a reference generator function or component 146, as well as program instructions to implement a frequency emulation function or component 148. The program instructions associated with the reference generator component 146 and the frequency emulation component 148 are executed by the first processor 142 in order to compute phase references 149U, 149V and 149W for the respective phase lines 119U, 119V and 119W of the inverter 118. The first processor 142 computes the phase references 149U, 149V and 149W according to the feedback value 132, the setpoint value 134, and the scaling factor 136.

In conjunction with a fixed frequency carrier generated by the second processing system 150, the first processing system 140 emulates a scaled frequency that is less than a switching frequency FS used by the second processing system 150 to generate a carrier for PWM switching of the inverter 118. The first processing system 140 implements the reference generator component 146 and optionally executes the frequency emulation component 148 in order to generate phase references 149U (labeled REFU in FIG. 1), 149V (REFV) and 149W (REFW) as values for the inverter phase lines 119U, 119V and 119W, respectively.

The second processing system 150 in one example is a field-programmable gate array (FPGA) with a second processor 152 and an associated second memory 154 (labeled MEM). In one example, the memory 154 includes program instructions, which when executed by the second processor 152, cause the processor 152 to implement a carrier generator function or component 156 and a PWM generator function or component 158. In one example, the second processor 152 implements the carrier generator function 156 by incrementing or decrementing a counter to generate a series of values that correspond to a triangular carrier waveform having a switching frequency (e.g., the example carrier waveform 402 having the switching frequency FS in FIG. 4 below). In one implementation, the second processor 152 executes the program instructions of the PWM generator component 158, including requesting updated phase reference values 149 for the respective inverter output phases U, V and W when the computed carrier reaches peaks and valleys. The second processor 152 receives the phase references 149 from the first processing system 140. In each of a series of control cycles, the second processor 152 compares each phase reference 149 with the carrier waveform to generate pulse width modulated switching control signals 159 for the inverter switching devices S1-S6.

As shown in FIG. 1, the controller 130 also includes a driver circuit 160. The driver circuit 160 includes suitable transistors, amplifiers, or other circuitry that generates signal suitable for actuating switches of the motor drive 102. In one example, including an active front and rectifier 114, the driver circuit 160 provides rectifier switching control signals 162 that turn the rectifier switches RS1-RS6 on and off to control conversion of input AC voltages to provide a regulated DC bus voltage in the DC bus circuit 116. In addition, the driver circuit 160 generates inverter switching control signals 164 according to the PWM switching control signals 159 from the second processing system 150. The inverter switching control signals 164 turn the inverter switches S1-S6 on and off to generate the AC phase voltage signals Vu, Vv, Vw at the inverter output 119 to directly or indirectly drive the load 106. The first and second processing systems 140 and 150 thereby provide closed-loop control of the speed, torque and/or other operating parameter of the driven motor load 106 according to the setpoint 134.

Figure 2:
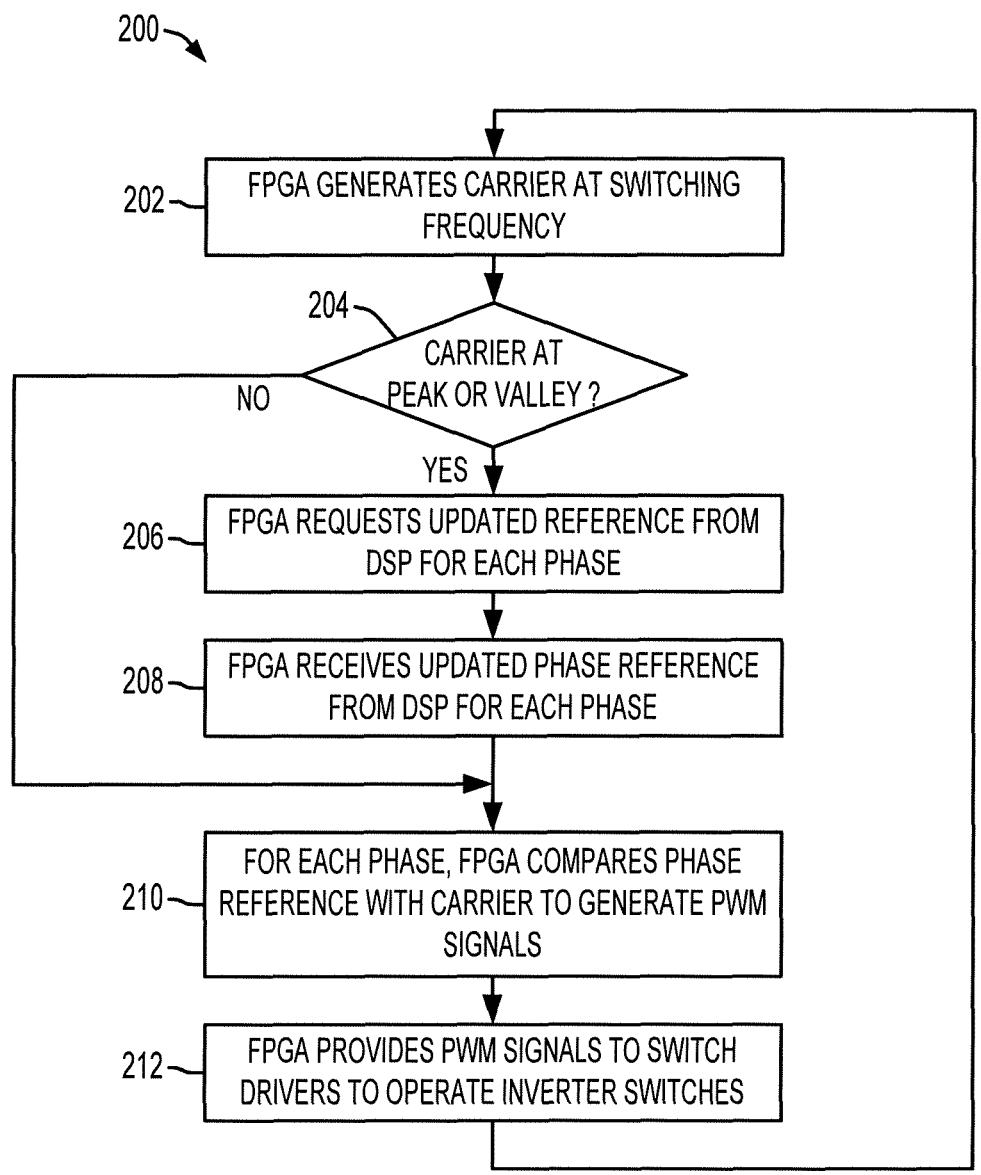
FIG. 2 is a flow diagram.

FIG. 2 shows an example method 200 for operation of the example second processing system 150 during operation of the motor drive 102. At 202, the second processing system (FPGA) 150 generates a carrier at a switching frequency. In one example, the second processor 152 executes program instructions of the carrier generator component 156 to implement the carrier generation at 202, and implements the subsequent processing at 204-212 in FIG. 2 by executing the program instructions of the PWM generator component 158 shown in FIG. 1. As discussed further below in connection with FIGS. 4 and 5, the second processing system 150 in one example provides the carrier at a constant switching frequency (e.g., also referred to as a carrier frequency), for example, using a counter to provide a triangular carrier waveform that repeats at the switching frequency FS. At 204 in FIG. 2, the second processor 152 determines whether the computed carrier value is at a peak or valley. If so (YES at 204), the second processor 152 requests updated phase references from the first processing system 140 (DSP) at 206. At 208, the second processor 152 receives the updated phase references from the first processing system 140. At 210, the second processor compares the phase reference for each inverter output phase with the carrier to generate the PWM signals 159, and the second processor 152 provides the PWM signals to the switch driver circuit 160 (FIG. 1) at 212 to operate the inverter switches S1-S6.

Figure 3:
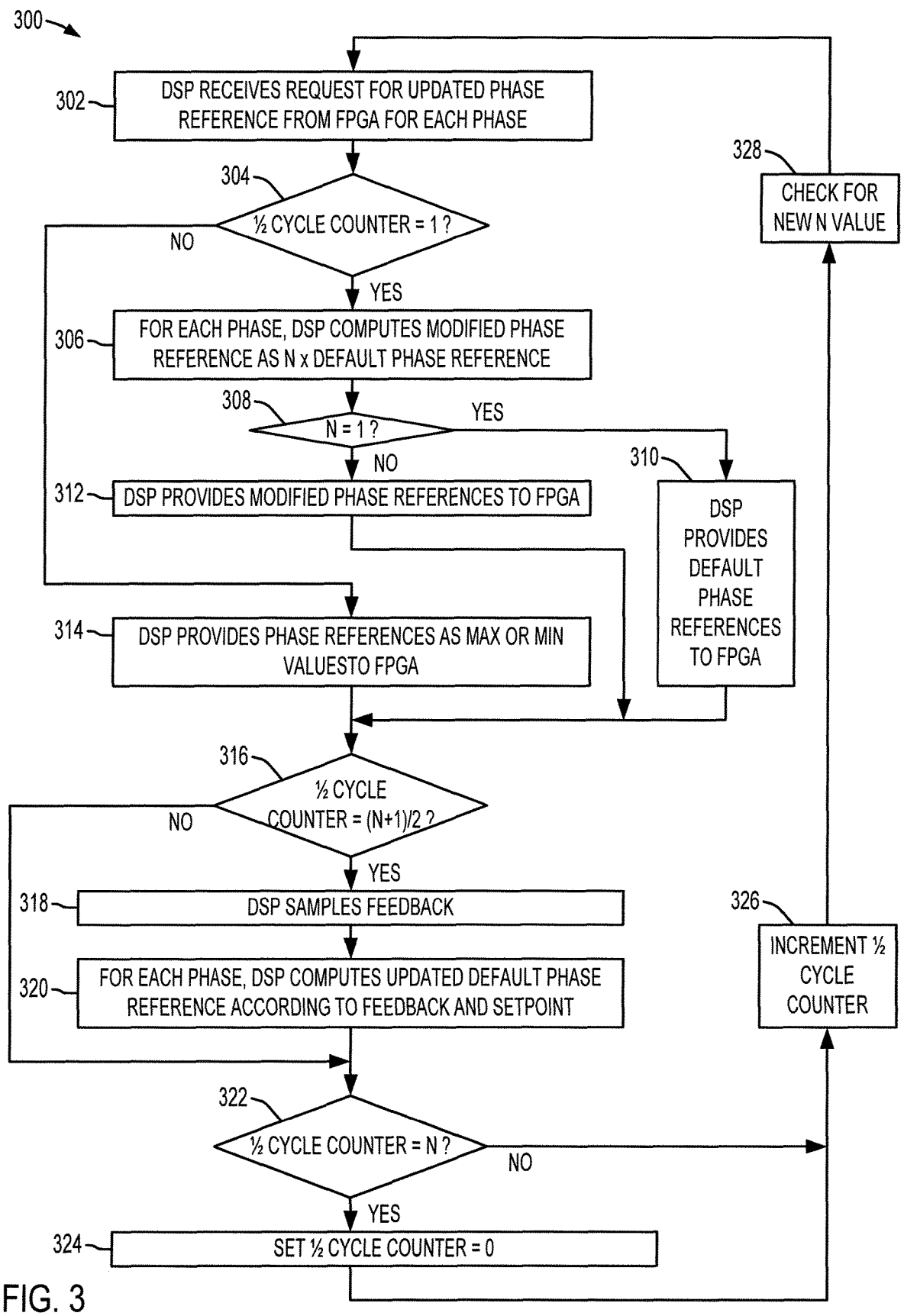
FIG. 3 is a flow diagram.
Figure 4:
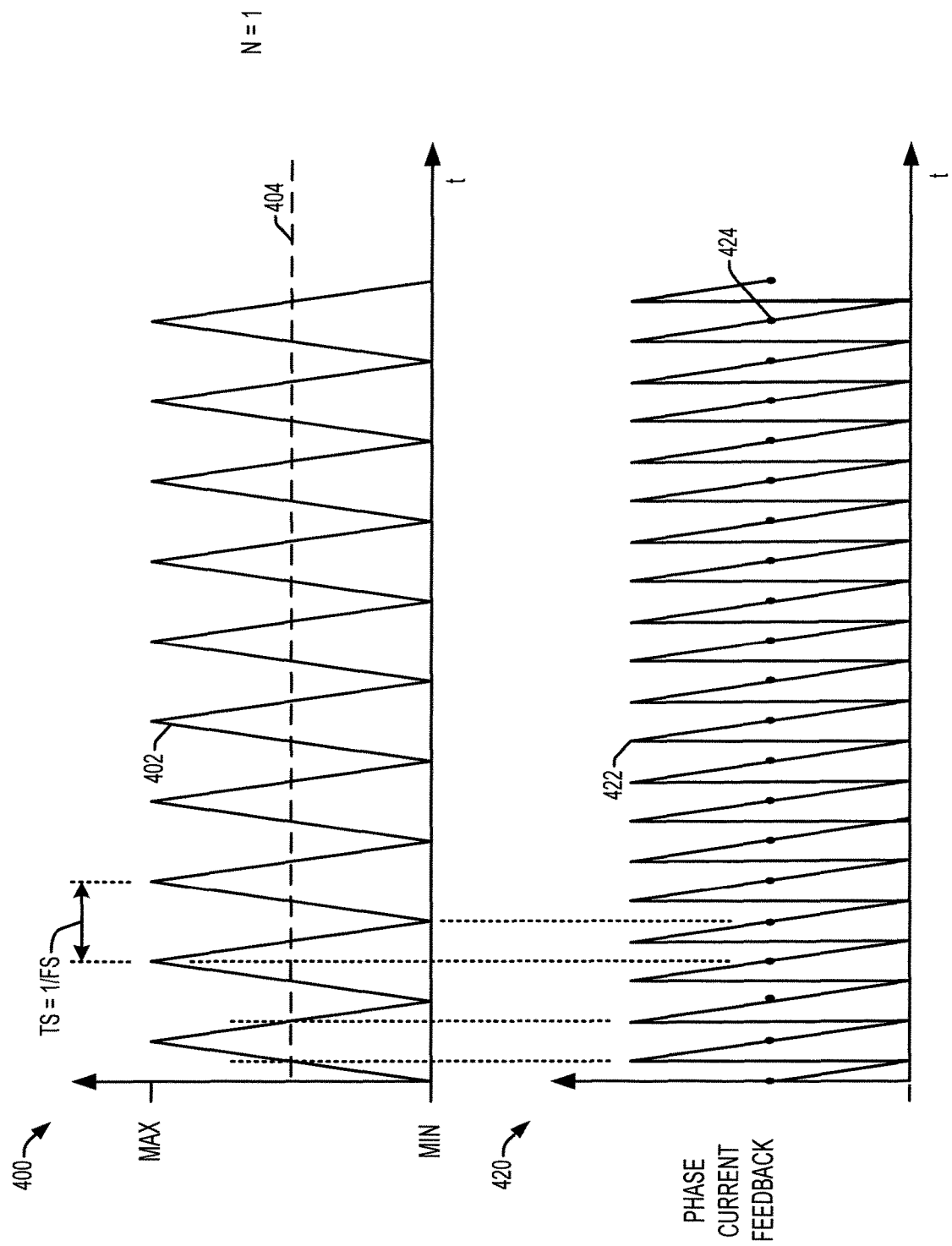
FIG. 4 is a waveform diagram.
Figure 5:
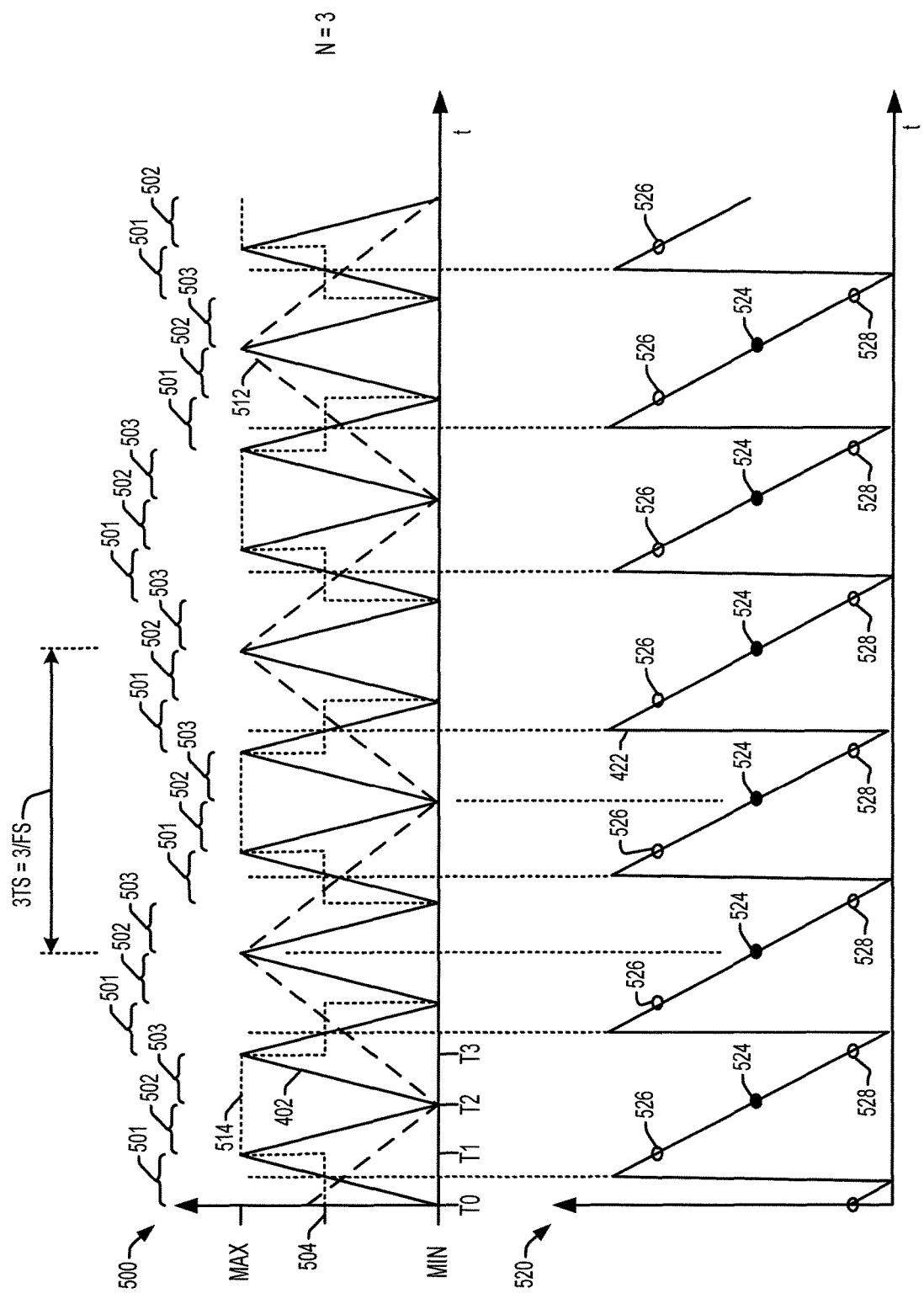
FIG. 5 is a waveform diagram.

Referring also to FIGS. 3-5, FIG. 3 shows a method 300 that illustrates operation of the first processing system 140. In addition, FIG. 4 illustrates an example carrier signal and an example phase current feedback signal in the motor drive 102, and FIG. 5 illustrates example emulated carrier and phase reference signals along with an example phase current feedback signal for scaled operation at a reduced switching frequency. In this regard, FIG. 4 shows a graph 400 illustrating an actual carrier signal 402 implemented as a triangular waveform ranging between a minimum value (MIN) and a maximum value (MAX). The graph 400 also includes an example phase reference 404 representing the phase reference value (e.g., modulating signal) for one of the inverter output phases U, V or W, as provided to the second processing system 150 by the first processing system 140 to implement closed-loop control of the motor load 106. The carrier signal 402 in one example is implemented as a series of values, for example, using a counter that is incremented or decremented over time. The carrier waveform 402 has a switching period TS that is the inverse of the switching frequency fs (e.g., TS=1/FS), which does not vary over time.

A graph 420 in FIG. 4 illustrates a sampled feedback current waveform 422 that represents an output phase current of the inverter 118 during operation of the power conversion system 100 with N=1. The graph 420 in FIG. 4 also includes sample points indicated by circles 424, at which the first processing system 140 samples the output current feedback. In this example, the sample points 424 correspondent time with the peaks and valleys of the carrier 402, although not a strict requirement of all possible implementations. In the illustrated implementation, the first processing system 140 selectively samples the feedback in response to a request for updated phase references from the second processing system 150, and the second processing system 150 sends these reference update requests at the peaks and valleys of the carrier 402.

In operation, the first processing system 140 operates to selectively emulate reduced switching frequency operation relative to the switching frequency FS of the carrier generated by the second processing system 150. This advantageously facilitates the advantages of switching loss reduction, etc. by reducing the effective operating frequency of the inverter 118 without adding extra communications between the first and second processing system 140 and 150, respectively. In particular, the first processing system 140 provides the phase references 149U, 149V and 149W as values to the second processing system 150 at an effective switching frequency set by the scaling factor 136 (N) independent of the actual switching frequency FS of the carrier generated by the second processing system 150. Accordingly, the first processing system 140 adapts the effective switching frequency of the inverter 118 according to the current scaling factor 136 without any additional communication with the second processing system 150.

In contrast, attempting to adjust the actual carrier frequency of the carrier signal used by the second processing system 150 (e.g., by varying the count-up/count-down increment in a counter implemented carrier generation approach) requires the first and second processing systems 140 and 150 to communicate switching frequency changes to one another. The described controller 130 in FIG. 1 instead implements frequency emulation by the first processing system 140, which also implements junction temperature calculation, dead time compensation, and other switching frequency dependent functions of the motor drive 102, without requiring additional communication between the first and second processing systems 140 and 150, respectively.

In the illustrated example, the scaling factor 136 is an odd integer N. For frequency reduction, N is greater than 2. In one implementation, the scaling factor 136 can be 1, which provides for operation at the default frequency set by the carrier generation of the second processing system 150. Where N is currently set to an odd integer value greater than 2, the carrier frequency FS is a default, and the first processor 142 emulates a scaled frequency that is the switching frequency FS divided by the scaling factor 136 (FS/N). In one implementation, the first processing system 140 can adapt the value N of the scaling factor 136, for example, according to one or more operating conditions of the motor drive 102. In this manner, for instance, the switching frequency can be reduced for low speed operation of the motor 106 or other situations in which switching losses can be reduced by decreased switching frequency. This provides the benefits of a lower switching frequency without reducing control bandwidth, and without requiring increased communication between the first and second processing systems 140 and 150, respectively. In one illustrated example, the value of N can be switched between 1 and 3 selectively according to the current value N of the scaling factor 136. In another possible implementation, an external control system (not shown) provides the value N of the scaling factor 136 to the first processing system 140 for dynamic adjustment of the effective switching frequency of the inverter 118.

Referring to FIGS. 3 and 5, the method 300 is implemented in the first processing system 140, and is illustrated and described below for the case in which the scaling factor 136 has a value N=3. FIG. 5 includes a graph 500 that shows multiple cycles of an emulated switching frequency that is reduced by a factor of N=3 relative to the switching frequency FS of the carrier implemented by the second processing system 150. In this example, the each half cycle of the emulated carrier includes three half cycles 501, 502 and 503 of the actual carrier 402. The graph 500 illustrates the actual carrier 402 discussed above in connection with FIG. 4, along with a dashed line curve 512 that shows an emulated triangular carrier at the emulated switching frequency (referred to as the scaled frequency) that is one third the switching frequency FS of the actual carrier 402. A dotted line curve 514 in the graph 500 shows a modified phase reference for one of the inverter output phases U, V or W generated by the first processing system 140 for the case where N=3. FIG. 5 also shows a graph 520, including a sampled feedback current waveform 422 that represents the output phase current of the inverter 118 during operation of the power conversion system 100 with N=3 for the output phase that corresponds to the example modified phase reference curve 514. The graph 500 also includes illustrated output current feedback sampling points 524 that corresponds to the peaks and valleys of the emulated triangular carrier curve 512, as well as feedback sampling points 526 and 528 that correspond to the other two peak/valley points of the actual carrier 402 that occur between the peaks and valleys of the emulated carrier curve 512.

FIG. 3 illustrates an example in which sampled current feedback signals are used in the closed-loop control. The first processing system 140 selectively samples the output current at the midpoint of each half cycle of the actual carrier signal generated by the second processing system 150, or at the midpoint of each half cycle of an emulated carrier signal, although not a requirement of all possible implementations.

The first processing system 140 implements the method 300 in order to emulate a scaled frequency that is the default switching frequency FS divided by the scaling factor 136.

At 302, the first processing system 140 receives a request from the second processing system 154 an updated phase reference for each inverter output phase U, V and W. At 304, the first processing system 140 determines whether a half cycle counter value is equal to 1. If so (YES at 304) the first processing system 140 computes a modified phase reference for each inverter output phase at 306 as a product of a default phase reference and the scaling factor 136. For the illustrated situation where the scaling factor 136 N=3, the first processing system 140 computes the modified phase reference for each inverter output phase as 3 times the corresponding default phase reference value. In this example, the first processing system 140 samples inverter output currents or other feedback information (e.g., feedback signal or signals 132 in FIG. 1 above) each half cycle of the carrier implemented by the second processing system 150, and for each phase, computes an updated default phase reference according to the feedback 132 and the setpoint 134 to implement closed-loop control.

FIG. 3 shows a determination at 308 as to whether the scaling factor N=1, in which case (YES at 308) the first processing system 140 provides the default (e.g., unscaled) phase references to the second processing system 150 at 310. If the scaling factor N is not equal to 1 (NO at 308), the first processing system 140 provides the modified phase references to the second processing system 150 at 312. In one implementation, the illustrated respective determination and action at 308 and 310 can be omitted, as any modified phase reference computed at 306 for the case of N=1 is the same as the default phase reference (i.e., the same reference values are provided at 310 and 312 for the case of N=1).

For the illustrated example where N=3, the first processing system 140 (e.g., implementing the frequency emulation component 148 in FIG. 1) effectively provides a modified phase reference to the second processing system 150 in the first half cycle 501 shown in FIG. 5. In this regard, the amplitude of the point 504 shown in the graph 500 represents the value of the modified phase reference for one of the inverter output phases as computed by the first processing system 140 for a time T0, which is three times the default phase value for that output phase. Depending on the feedback and set point conditions of the motor drive 102 at the time T0, the value of the default reference value will generally vary between the minimum value MIN and the maximum value MAX, whereas the modified reference values will be multiplied by the scaling factor 136. Accordingly, in one implementation, the controller 130 implements frequency emulation (reduced switching frequency operation) only where the magnitudes of the default phase reference values are low, e.g., less than or equal to 1/N times a normal phase reference span. For instance, the controller 130 in the illustrated example may use the reduced switching frequency operation for N=3 only where the computed default reference values are in the lower one third of the normal control span, although not required of all possible implementations.

In the illustrated example of FIG. 5, the first processing system 140 computes the modified phase reference value at the level 504 shown in the graph 500 for the first half cycle 501, which is provided to the second processing system 150 for comparison with the actual carrier 402 between times T0 and T1. As shown in the graph 520, the modified phase reference is exceeded by the actual carrier 402 between T0 and T1, causing a corresponding switch change in the associated phase of the inverter 118, leading to a rise in the corresponding phase current curve 422. Thereafter, the example phase current curve 422 decreases, and example sample points 526, 524 and 528 are shown in the decreasing phase current curve portion.

The method 300 in FIG. 3 also provides for the remaining half cycles (e.g., the second and third half cycles in the example where N=3). Where the half cycle counter is not equal to one (e.g., NO at 304), the first processing system 140 provides the phase references at 314 as a maximum or minimum value to the second processing system 150. Accordingly, for the second half cycle 502 and the third half cycle 503, the example phase reference is set to the maximum value in the second half cycle from T1 through T2, and for the third half cycle 503 from T1 through T3, and the first processing system 140 provides the corresponding values to the second processing system 150 accordingly. In this example, therefore, the first processing system 140 emulates the scaled frequency by computing providing the modified phase reference to the second processing system 150 in the first half cycle 501 for comparison with the carrier waveform 402, and providing the phase reference to the second processing system 150 as a minimum or maximum value in the N−1 remaining half cycles (e.g., 502 and 503) for each of the phase lines 119U, 119V and 119W of the inverter 118. In this example, the modified phase reference is computed as N times the default phase reference, and the resulting inverter output current for the given phase is the same as would be the case for no frequency scaling, since the modified phase reference is used for 1/N of the half cycles in each series of N half cycles of the actual carrier 402. Accordingly, proper control is maintained without loss of control bandwidth, while allowing the effective switching frequency of the inverter 118 to be scaled. Moreover, as previously mentioned, the switching frequency emulation performed by the first processing system 140 advantageously mitigates or avoids any increase in the require communication between the first and second processing systems 140 and 150, respectively.

Continuing in FIG. 3, the first processing system 140 provides the phase references at 310, 312 or 314 for each given half cycle of the actual carrier 402, and then determines at 316 whether the half cycle counter is at the midpoint (e.g., (N+1)/2) of the N half cycle sequence. If so (YES at 316), the first processing system 140 samples the feedback at 318, and for each phase, computes an updated default phase reference according to the sampled feedback and the setpoint at 320. As shown in the graph 520 of FIG. 5, this advantageously facilitates feedback sampling in the second half cycle 502 at the sample points 524 in the feedback current curve 422. In one possible implementation, the second processing system 150 requests updated phase references at peaks and valleys of the carrier 402, corresponding to the points 526, 524 and 528 at the times T1, T2 and T3, respectively, in FIG. 5. In one implementation, moreover, the first processing system 140 may sample the output current feedback 422 at all three of these times, and selectively discard the feedback samples obtained at the points 526 and 528 (e.g., discard the samples from time T1 and time T3), in which case the first processing system 140 only uses the feedback current value sampled at the times T2 (e.g., points 524) in computing the default phase references. In another implementation, as shown in FIG. 3, the first processing system 140 samples the feedback only during the middle half cycle of the N half cycle sequence according to the illustrated processing at 316, 318 and 320.

The example method 300 continues at 322, where the first processing system 140 determines whether the half cycle counter is equal to the scaling factor 136 (=N). If so (YES at 322), the first processing system 140 sets the half cycle counter to zero at 324. In either case, the first processing system 140 increments the half cycle counter at 326 before returning to await another request for updated phase references from the second processing system 150 at 302 as described above. In one example, the frequency emulation component 148 also includes program instructions that cause the first processing system 142 again check for an update to the scaling factor 136 at 328 in FIG. 3. In this manner, the method 300 provides for dynamic adjustment of the frequency emulation processing by the first processing system 140, for instance, by receiving updates to the value N of the scaling factor 136 from an external system (not shown). As previously discussed, moreover, the value N of the scaling factor 136 can also be modified by other processes or components of the controller 130, for example, by an outer control loop function implemented by the controller 130, which dynamically implements switching frequency scaling and emulation for certain operating conditions. The described examples thus allow default operation (e.g., N=1), and selective adjustment of the effective switching frequency in combination with switching frequency emulation at modified frequencies scaled by a factor of 3, 5, 7 or other odd integer scaling factor 136.

In the preceding specification, various embodiments have been described with reference to the accompanying drawings. It will be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A power conversion system, comprising:
   a rectifier, including a rectifier input configured to receive a rectifier AC input signal, and a rectifier output configured to provide a DC output signal to a DC bus circuit;
   an inverter, including a DC input coupled with the DC bus circuit, an inverter output having multiple phase lines, and a plurality of inverter switching devices coupled between the DC input and the inverter output and configured to provide an inverter output signal at the inverter output to directly or indirectly drive a load;
   a first processing system configured to compute phase references for the respective phase lines of the inverter according to a feedback value, a setpoint value, and a scaling factor to emulate a scaled frequency that is less than a switching frequency; and
   a second processing system configured to:
      generate a carrier waveform having the switching frequency,
      receive the phase reference from the first processing system for each inverter phase line, and
      compare each phase reference with the carrier waveform to generate pulse width modulated switching control signals for the inverter switching devices.

2. The power conversion system of claim 1, further comprising a driver circuit configured to operate the switching devices according to the pulse width modulated switching control signals.

3. The power conversion system of claim 1, wherein the first processing system is configured to emulate a scaled frequency that is the switching frequency divided by the scaling factor, the scaling factor being an odd integer N.

4. The power conversion system of claim 3, wherein the first processing system is further configured to emulate the scaled frequency by, for each set of N half cycles of the carrier waveform:
   computing a default phase reference according to the feedback value and the setpoint value;
   computing a modified phase reference as a product of the default phase reference and the scaling factor;
   in a first half cycle, for each of the phase lines of the inverter, providing the modified phase reference to the second processing system for comparison with the carrier waveform to generate the pulse width modulated switching control signals for the inverter switching devices; and
   in N−1 remaining half cycles, for each of the phase lines of the inverter, providing the phase reference to the second processing system as a minimum or maximum value for comparison with the carrier waveform to generate the pulse width modulated switching control signals for the inverter switching devices.

5. The power conversion system of claim 4, wherein the first processing system is further configured to sample the feedback value in a middle half cycle of each set of N half cycles of the carrier waveform.

6. The power conversion system of claim 5, wherein the first processing system is further configured to, in the N−1 remaining half cycles of a given set of N half cycles of the carrier waveform, for each of the phase lines of the inverter:
   provide the phase reference to the second processing system as a maximum value when a second half cycle of the given set of N half cycles begins with a peak of the carrier waveform; and
   provide the phase reference to the second processing system as a minimum value when the second half cycle of the given set of N half cycles begins with a valley of the carrier waveform.

7. The power conversion system of claim 4, wherein the first processing system is further configured to, in the N−1 remaining half cycles of a given set of N half cycles of the carrier waveform, for each of the phase lines of the inverter:
   provide the phase reference to the second processing system as a maximum value when a second half cycle of the given set of N half cycles begins with a peak of the carrier waveform; and
   provide the phase reference to the second processing system as a minimum value when the second half cycle of the given set of N half cycles begins with a valley of the carrier waveform.

8. The power conversion system of claim 4, wherein the first processing system is a digital signal processor (DSP) with a first processor and a first memory, and wherein the second processing system is a field-programmable gate array (FPGA) with a second processor and a second memory.

9. A controller, comprising:
   a first processing system configured to compute phase references for respective phase lines of an inverter according to a feedback value, a setpoint value, and a scaling factor to emulate a scaled frequency that is less than a switching frequency; and
   a second processing system configured to:
      generate a carrier waveform having the switching frequency, receive the phase reference from the first processing system for each inverter phase line, and compare each phase reference with the carrier waveform to generate pulse width modulated switching control signals for switching devices of the inverter.

10. The controller of claim 9, further comprising a driver circuit configured to operate the switching devices of the inverter according to the pulse width modulated switching control signals.

11. The controller of claim 9, wherein the first processing system is configured to emulate a scaled frequency that is the switching frequency divided by the scaling factor, the scaling factor being an odd integer N.

12. The controller of claim 11, wherein the first processing system is further configured to emulate the scaled frequency by, for each set of N half cycles of the carrier waveform:

computing a default phase reference according to the feedback value and the setpoint value;

computing a modified phase reference as a product of the default phase reference and the scaling factor;

in a first half cycle, for each of the phase lines of the inverter, providing the modified phase reference to the second processing system for comparison with the carrier waveform to generate the pulse width modulated switching control signals for the inverter switching devices; and in N−1 remaining half cycles, for each of the phase lines of the inverter, providing the phase reference to the second processing system as a minimum or maximum value for comparison with the carrier waveform to generate the pulse width modulated switching control signals for the inverter switching devices.

13. The controller of claim 12, wherein the first processing system is further configured to sample the feedback value in a middle half cycle of each set of N half cycles of the carrier waveform.

14. The controller of claim 12, wherein the first processing system is further configured to, in the N−1 remaining half cycles of a given set of N half cycles of the carrier waveform, for each of the phase lines of the inverter:

provide the phase reference to the second processing system as a maximum value when a second half cycle of the given set of N half cycles begins with a peak of the carrier waveform; and provide the phase reference to the second processing system as a minimum value when the second half cycle of the given set of N half cycles begins with a valley of the carrier waveform.

15. The controller of claim 12, wherein the first processing system is a digital signal processor (DSP) with a first processor and a first memory, and wherein the second processing system is a field-programmable gate array (FPGA) with a second processor and a second memory.

16. The controller of claim 9, wherein the first processing system is a digital signal processor (DSP) with a first processor and a first memory, and wherein the second processing system is a field-programmable gate array (FPGA) with a second processor and a second memory.

17. A method, comprising:

using a first processor, computing phase references for respective phase lines of an inverter according to a feedback value, a setpoint value, and a scaling factor to emulate a scaled frequency that is less than a switching frequency; and using a second processor:

generating a carrier waveform having the switching frequency, receiving the phase reference from the first processing system for each inverter phase line, comparing each phase reference with the carrier waveform to generate pulse width modulated switching control signals for switching devices of the inverter, and using a driver circuit, operating the switching devices of the inverter according to the pulse width modulated switching control signals to drive a load.

18. The method of claim 17, further comprising, using the first processor, emulating a scaled frequency that is the switching frequency divided by the scaling factor, the scaling factor being an odd integer N, by:

computing a default phase reference according to the feedback value and the setpoint value;

computing a modified phase reference as a product of the default phase reference and the scaling factor;

in a first half cycle, for each of the phase lines of the inverter, providing the modified phase reference to the second processing system for comparison with the carrier waveform to generate the pulse width modulated switching control signals for the inverter switching devices; and in N−1 remaining half cycles, for each of the phase lines of the inverter, providing the phase reference to the second processing system as a minimum or maximum value for comparison with the carrier waveform to generate the pulse width modulated switching control signals for the inverter switching devices.

19. The method of claim 18, further comprising, using the first processor:

sampling the feedback value in a middle half cycle of each set of N half cycles of the carrier waveform.

20. The method of claim 18, further comprising, using the first processor, in the N−1 remaining half cycles of a given set of N half cycles of the carrier waveform, for each of the phase lines of the inverter:

providing the phase reference to the second processing system as a maximum value when a second half cycle of the given set of N half cycles begins with a peak of the carrier waveform; and provide the phase reference to the second processing system as a minimum value when the second half cycle of the given set of N half cycles begins with a valley of the carrier waveform.

* * * * *